United States Patent [19]

Pivit et al.

[11] Patent Number: 4,891,009
[45] Date of Patent: Jan. 2, 1990

[54] APPARATUS FOR HOLDING WORKPIECES

[75] Inventors: Werner Pivit, Frankfurt; Ralf Nachtsheim, Hanau, both of Fed. Rep. of Germany

[73] Assignee: Leybold Aktiengesellschaft, Hanau am Main, Fed. Rep. of Germany

[21] Appl. No.: 118,955

[22] Filed: Nov. 12, 1987

[30] Foreign Application Priority Data

May 26, 1987 [DE] Fed. Rep. of Germany ....... 3717712

[51] Int. Cl.$^4$ .............................................. F24H 1/00
[52] U.S. Cl. .................................... 432/223; 432/225; 432/233; 432/226
[58] Field of Search ............... 432/224, 253, 225, 226, 432/233, 239, 223

[56] References Cited

U.S. PATENT DOCUMENTS

| 4,142,580 | 3/1979 | Bailey | 432/223 |
| 4,244,421 | 1/1981 | Kuhlmann | 432/223 |
| 4,570,053 | 2/1986 | Ades et al. | 432/225 |
| 4,580,972 | 4/1986 | Hsiung | 432/225 |
| 4,673,122 | 6/1987 | Dubey | 432/225 |

Primary Examiner—Henry C. Yuen
Attorney, Agent, or Firm—Felfe & Lynch

[57] ABSTRACT

In an apparatus for mounting workpieces or substrates for transport between a receiving or issuing station and a coating station in the interior of a vacuum coating chamber and for the control of the temperature of the workpieces during cathode sputtering, the workpiece carrier is in the form of a hollow body partially filled with a heat transfer medium. On the side of the workpiece carrier facing the coating source there is provided a workpiece socket in the form of an oval channel in which workpieces such as bearing shells can be placed. Parallel to the longitudinal edges of the groove-like workpiece socket, edge strips of gripping jaws are disposed, which hold the workpieces in the workpiece socket. The workpiece carrier is furthermore provided with a heat transfer head against which cooling plates or bodies can be pressed, which are connected by flexible pressure hoses to a cooling circuit.

11 Claims, 5 Drawing Sheets

APPARATUS FOR HOLDING WORKPIECES

BACKGROUND OF THE INVENTION

The invention relates to an apparatus for holding workpieces for transport between a receiving or issuing station and a coating station in the interior of a coating chamber, and for controlling the temperature of the workpieces during the coating process.

The invention is addressed to the object of creating an apparatus which will accommodate the workpieces—e.g., bearing shells for piston engines—such that they will be aligned in a precisely defined position and shape with the workpiece holder, while the apparatus is at the same time to prevent the workpieces from heating up excessively during a coating process—e.g., sputtering—in an evacuated coating chamber. The workpiece holders are at the same time to remain freely movable, and therefore they are to be constructed without coolant lines or other conduits for fluids under pressure. Lastly, the apparatus should permit the easy entry and exit of the workpieces in the coating chamber, and also assure that, in the event of any disturbance in the coating apparatus, such as a power failure for example, the workpieces will remain safe in their holders on the workpiece carrier.

SUMMARY OF THE INVENTION

This object is achieved according to the invention by a workpiece carrier constructed as a hollow body or pressure body, filled at least partially with a heat transfer medium. This body has, on a surface facing the coating source, one or more outwardly open workpiece holders in the form of recesses, cavities or grooves. Movable holding means are provided on the same surface which retain the workpieces in the workpiece holder, while at least a portion of the carrier is a heat transfer head which during the coating process cooperates with a cooling body or cooling plate which is connected by one or more lines under pressure to a coolant source or to a coolant circuit.

Preferably, the workpiece carrier is of a substantially parallelepipedal shape. Its surface facing the coating source in the coating chamber is provided with a workpiece socket forming a kind of oval, into which the workpieces can be laid, and which have supporting surfaces facing the coating source, to which surfaces gripping jaws can be applied, which in turn are held and guided on the workpiece carrier.

Advantageously, one or more contact shells are laid in the recess or channel forming the socket, and are formed of a material that is an especially good heat conductor and is resiliently within narrow limits.

Parallel to the side walls of workpiece socket, edge strips are affixed to the face of the workpiece carrier, each pair of edge disposed opposite one another with a distance between them that is smaller than the overall width of a workpiece before it is laid in the workpiece socket.

To permit a very rapid transfer of heat from the workpiece to the workpiece carrier, the shell is formed of metal wires or metal strips woven or braided or knitted together.

In an alternative embodiment, the contact shell has a plurality of laminae with their edges outward, which closely apply themselves to the contact surface carpet, of the workpiece in the manner of the pile of a and thus bring about a rapid transfer of heat.

It is desirable for the gripper jaws to be pivoted on pins on the workpiece carrier. The pins are in turn mounted on pull rods operated by a crossbeam which can be driven pneumatically, electrically or hydraulically, or is driven by springs.

Advantageously a bore opens into the workpiece socket, and runs all the way through the workpiece carrier, and an ejector rod is mounted in this bore, which is operatively connected to the crossbeam and pushes the workpiece out of the workpiece socket after the coating has been completed.

To permit the transport of the workpieces between the individual stations of a coating apparatus, the workpiece carrier has hangers by which it is held on a transport carriage or conveyor belt. A chain can, of course, be provided instead of a conveyor belt, running over pulleys or guides and driven by suitable electric motors or hydraulic motors, the individual workpiece carriers being attached to the chain or hung on the chain by the hangers.

According to the invention, the cooling body or plate is in the form of a hollow body filled with a coolant, which is connected by a hose or pipe to a heat exchanger, shut-offs and/or control valves being inserted into the lines and being controlled by a temperature sensor with servomotor.

Preferably, the cooling bodies are associated in pairs with each workpiece carrier, one of the cooling bodies being in contact with a section facing the coating source on the front of the workpiece carrier and the other cooling body being in contact with the back of the workpiece carrier on the opposite side from this section.

DETAILED DESCRIPTION OF PREFERRED EMBODIMENT

Figure 1:
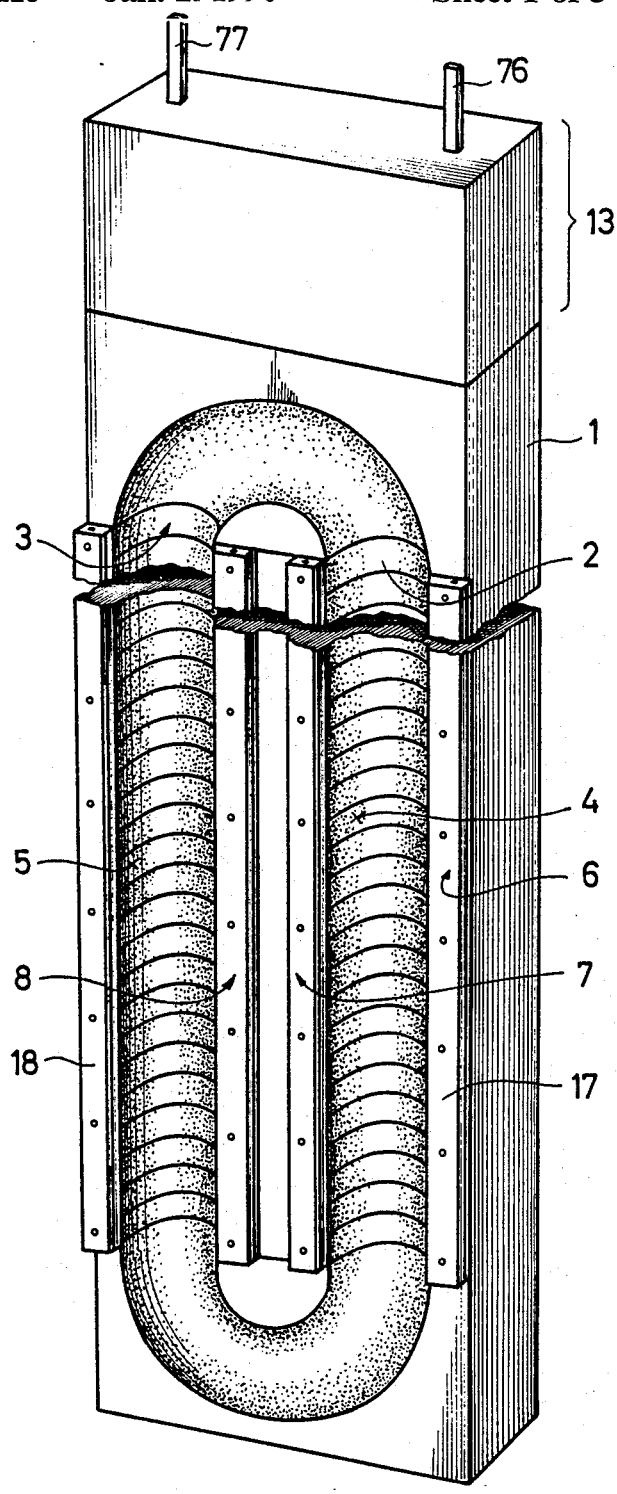
FIG. 1 is a perspective view of a workpiece carrier without the corresponding cooling body, in which the gripping jaws and crossbeam have been omitted for greater ease in comprehension.
Figure 2:
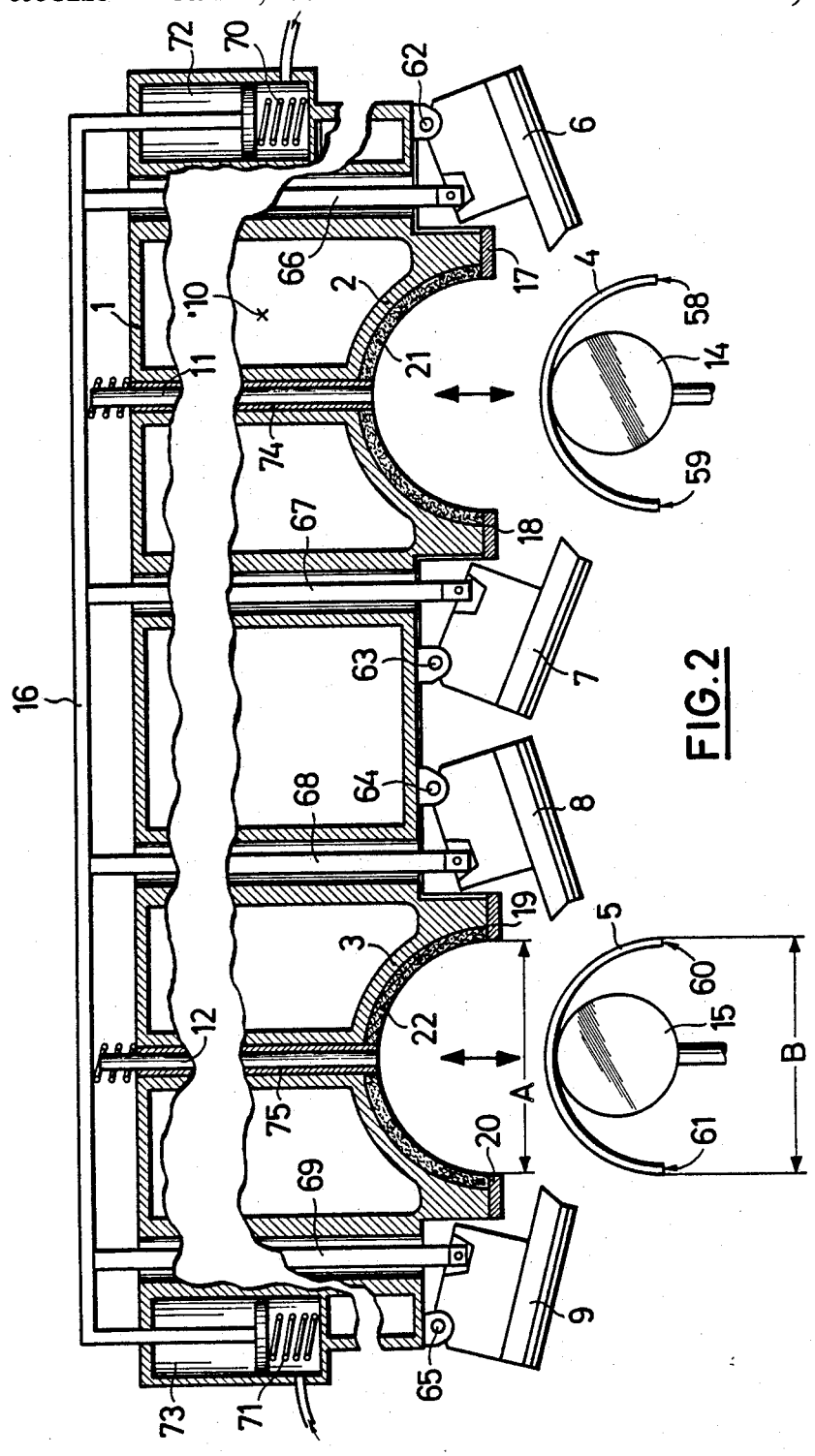
FIG. 2 is a cross section transversely through a workpiece carrier, indicating also the pushers necessary for the automatic feeding of the workpieces.

The workpiece carrier 1 consists essentially of the following: a hollow body which is constructed as a pressure container and partially filled with a heat transfer medium 10, a workpiece socket 2-3 which simultaneously creates the thermal contact between the workpiece 4-5 and the hollow body 1, the gripping jaws 6-9 which hold the workpiece 4-5 in a precisely defined position, ejector rods 11-12 and an upper section of the workpiece carrier which forms a heat transfer head 13. In a loading station (not shown) situated in front of the coating apparatus, the gripping jaws 6 to 9 of the workpiece carrier are opened, and the workpieces 4-5 are placed in the workpiece socket 2-3; the workpieces can be handled either manually or automatically. By means of the pushers 14-15 at the loading station, workpieces are pressed against the substrate socket 2-3 with a measured force and then secured by application of the gripping jaws 6-9. The actuation of a crossbeam 16 is performed through springs or by means of a pneumatic device, or by means of a combination of both. This brings it about that the workpieces 4-5, which in this application are semicylindrical, will assume a defined radius, will be covered in a particular way by the edge strips 17-20 and will thus be able to be coated within precisely defined limits. Contact between the workpiece 4-5 and the heat removal system is achieved by a metal shell 21-22. These metal shells 21-22, are so constructed that, by resilient contact, a large number of laminations, wires or strips together will result in a very great thermal transfer area on the workpiece 4-5. In this manner, it is not necessary for the achievement of intimate contact to have surfaces precisely machined within close tolerances in the workpiece socket 2-3, or to apply high pusher pressing forces. The good heat transfer from the metal shell 21-22, to the carrier system/heat transfer system is assured by the fact that the metal shell is joined to the hollow body by soldering. After they are loaded and locked up, the workpiece carriers 1 are set up perpendicularly with the heat transfer head 13 on top, and hung in a suitable transport system. The hollow body 1 is in this special application filled with a defined amount of distilled, degassed water. The amount of water poured in under vacuum assures under operating conditions a level of coolant in the hollow body 1 which throughout the coating process will assure cooling of the workpieces. For applications which call for different temperature conditions for the coating, other heat transfer media such as oils, alcohols or molten metals, salt, etc., can be used.

Figure 3:
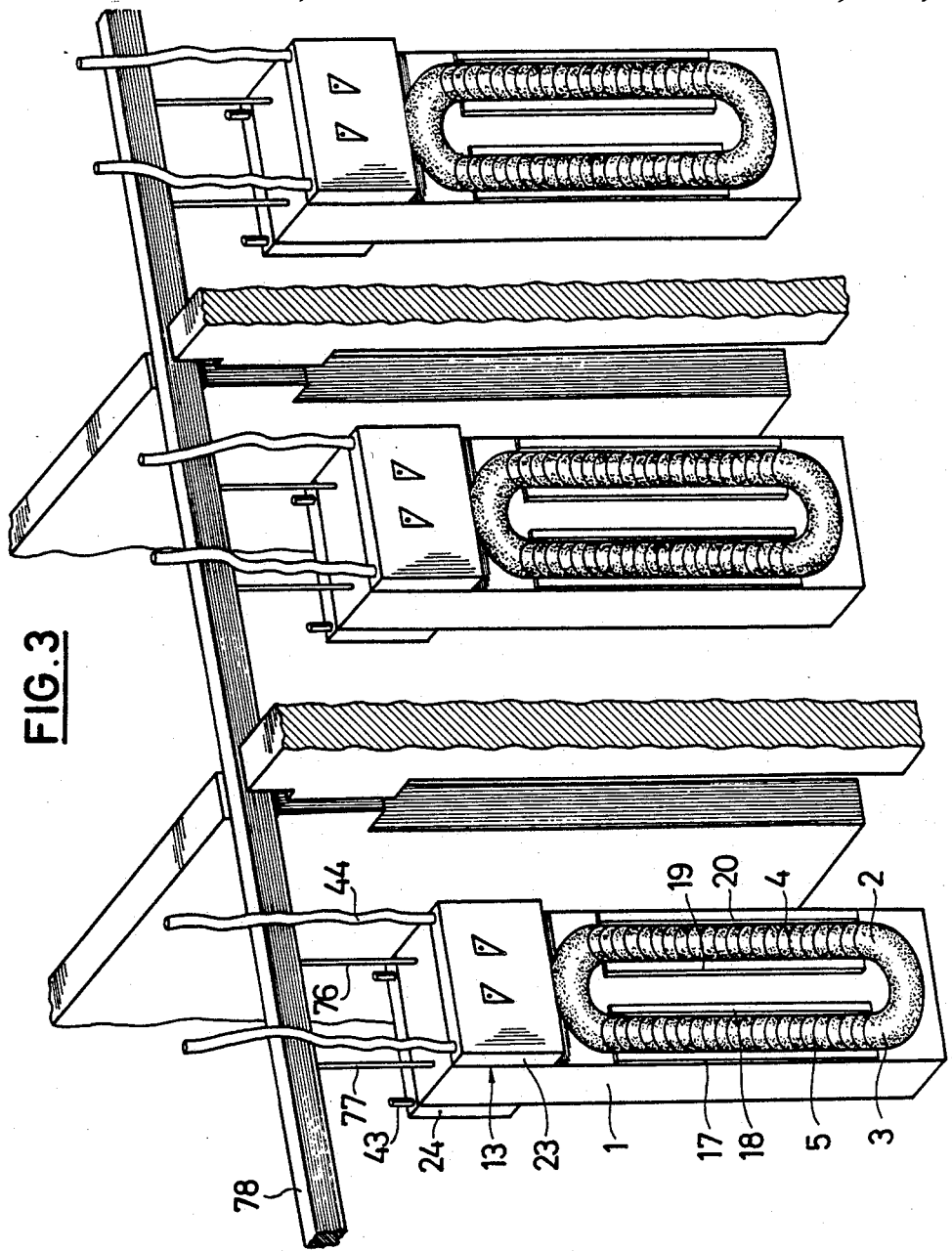
FIG. 3 is a greatly simplified perspective view of three workpiece carriers suspended from a conveyor belt.
Figure 4:
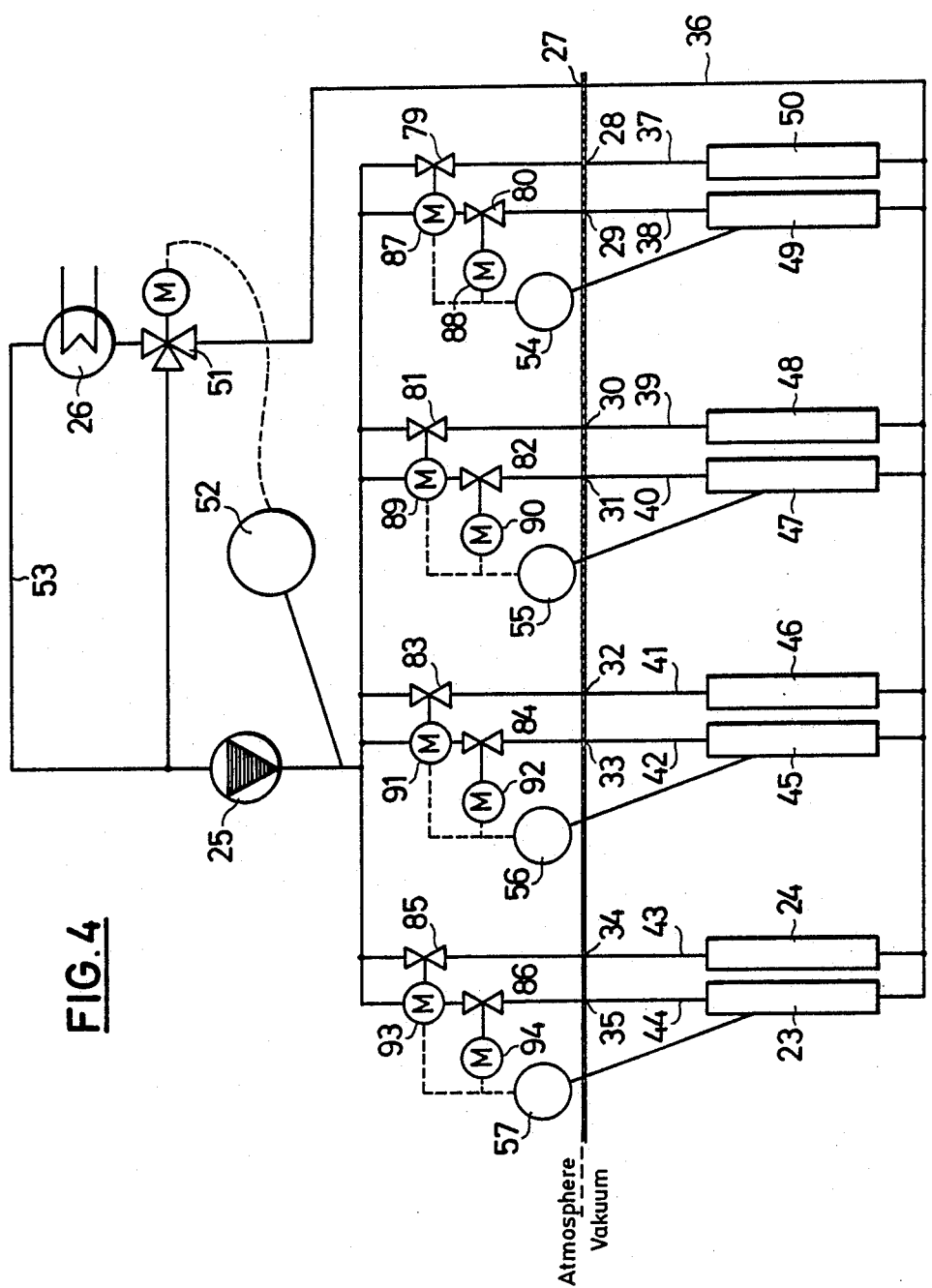
FIG. 4 is a schematic drawing of a cooling circuit for four workpiece carriers, the individual units being represented as symbols only.
Figure 5:
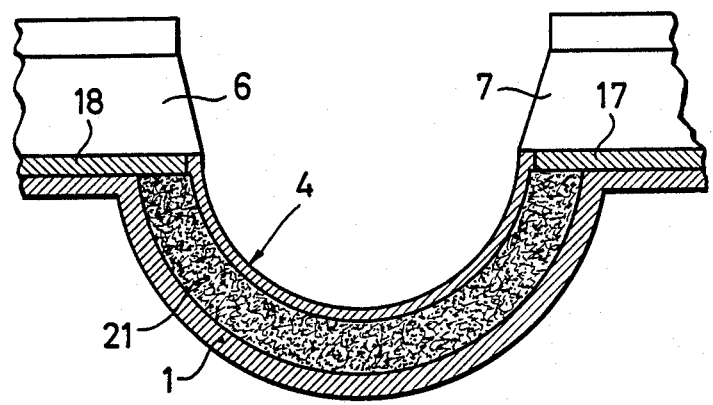
FIG. 5 is a cross section transversely through a workpiece holder with edge strips, contact shell and gripping jaws.

After the hollow body 1 or the loaded workpiece carrier has been placed in the sputtering chamber, cooling plates 23-24, through which water is flowing, are applied to the heat transfer head 13 of the hollow body 1 (FIG. 3), one being associated with each work position. By means of this cooling system (FIG. 4) connected to the outside through vacuum lead-throughs 27-35, it is possible to establish a precisely defined temperature at the workpieces 4-5, allowing for the time constants of the system.

The heat produced at the workpiece 4-5 is carried away to the hollow body wall through the metal shells 21-22. From there the heat is passed over to the heat transfer medium 10. According to the saturation equilibrium, a certain amount of the coolant supply evaporates, rises upward by free convection, and there it is precipitated at the heat transfer head 13—the heat sink—and drips back into the coolant receiver. The re-cooling circuit of the carrier consists (according to FIG. 4) essentially of a continuously running pump 25, a re-cooling system or a heat exchanger 26, vacuum lead-throughs 27-35, flexible tubes 36 and 44, copper plates 23-24 and 45-50 through which the medium is flowing, means for pressing the cooling plates, a three-way control valve 51 with meter 52 and regulator for the first-runnings temperature, as well as individual secondary regulating circuits with throttle valve and temperature tap for each cooling plate 23-24 and 45-50. The regulation of the substrate temperature is performed indirectly through temperature and flow adjustment in the re-cooling circuit 53. The temperature that is required for the regulation at the substrate 4-5, is detected in the area of the heat transfer head 13 on the hollow body 1, since the temperature gradient through the carrier in the stationary state is negligible. Since the carrier is under high voltage during the coating process, it is necessary that the temperature be detected contactlessly or by special, electrically nonconductive measuring contact instruments 54-57. The temperature thus measured is used to control the rate of flow of water in the cooling plates, along with the temperature at the cold end of the carrier. Therefore, since the heat input from the process is to be considered as constant, a definite temperature level establishes itself through the carrier. An additional control circuit, with a temperature sensor in the first-runnings and three-way bypass valve, provides for an appropriate first-runnings temperature level.

The apparatus described above finds application in the production of wear-resistant coatings applied by sputtering to bearing shells on the in-line principle. Other applications are conceivable in all in-line coating apparatus set up for automatic handling.

For the production of bearing shells of long useful life a type of coating can be used which, consisting of a prime coating and the actual wear coating, greatly increases the life of such bearings. The build-up of the layer is performed continuously in successive steps in a vacuum chamber:

Plasma etching

Sputtering of the prime coating

Sputtering the wear coating. The energies applied are almost exclusively converted to heat and they heat the workpiece or substrate and the structure material. Experiments have shown, however, that the quality and hence also the useful life of the bearing shells depends greatly on the temperature established in the sputtering of the coatings. From this arises the requirement that the workpieces be held constantly at one temperature level during the procedures. The range between 160° and 180° C. proves to be a good temperature level for the present type of coating. To adapt the concept to other types of coatings, the possibility is foreseen, beyond that, of controlling other temperature levels. For this purpose, in further development of a return system concept for an in-line sputtering chamber, a workpiece socket is developed which has the above-described heat-removal/temperature control system described in addition to its function as a carrier.

What is claimed is:

1. Apparatus for mounting workpieces or substrates for transport between a receiving or issuing station and a coating station in the interior of a vacuum coating chamber and for controlling the temperature of the workpieces during the coating process, said apparatus comprising a coating source which faces said workpieces when said workpieces are at said coating station, characterized by a workpiece carrier filled at least partially with a heat transfer medium, which carrier has on a lateral surface facing the coating source outwardly open workpiece socket means, movable holding means being provided on the same surface which lock the workpieces in the workpiece socket means, and wherein at least a portion of said carrier forms a heat transfer head which during the coating process cooperates with a cooling body which is connected via one or more pressure fluid lines to a coolant source or a coolant circuit.

2. Apparatus according to claim 1, characterized in that the workpiece carrier has a substantially parallelepipedal form, said workpiece socket means being formed as a substantially oval endless channel having supporting surfaces into which the workpieces can be laid and to which the holding means can be applied, said holding means being in the form of jaws which in turn are held and guided on the workpiece carrier.

3. Apparatus according to claim 1, characterized in that one or more contact shells are laid into the workpiece socket means and are formed of a material that is resiliently deformable within narrow limits and has an especially good heat conductivity.

4. Apparatus according to claim 1, characterized in that edge strips are fixedly disposed on the outside surface of the workpiece carrier, parallel to the side walls of the workpiece socket means, each pair of oppositely situated edge strips including between them a distance which is smaller than the entire width of a workpiece not inserted into the workpiece socket.

5. Apparatus according to claim 3, characterized in that the contact shell is formed of metal wires or metal strips woven, braided or knitted together.

6. Apparatus according to claim 3, characterized in that the contact shell has a plurality of outwardly standing lamellae which apply themselves tightly to the contact surface of the workpiece in the manner of carpet pile and thus produce a rapid transfer of heat.

7. Apparatus according to claim 1, characterized in that the holding means comprises gripping jaws which are pivotably mounted on the workpiece carrier on pins which in turn are linked to pulling members which are driven by a movable crossbeam.

8. Apparatus according to claim 1, characterized in that a bore opens in the area of the workpiece socket and is brought all the way through the workpiece carrier, an ejector rod being mounted in the bore, which is operatively connected with the crossbeam and pushes the workpiece out of the workpiece socket when the coating is completed.

9. Apparatus according to claim 1, characterized in that the workpiece carrier has hangers with which it is held on a transport carriage or conveyor belt.

10. Apparatus according to claim 1, characterized in that the cooling body is constructed as a hollow body filled with a coolant and is connected through lines to a heat exchanger, while valves are inserted into the lines and are operated through a temperature sensor by a servo motor.

11. Apparatus according to claim 1, characterized in that the cooling bodies are associated in pairs with each workpiece carrier, one of the cooling bodies in each case engaging a section facing the coating source on the front side of the workpiece carrier and the other cooling body engaging the back of the workpiece carrier on the opposite side from that section.

* * * * *